United States Patent [19]
Yamada et al.

[11] Patent Number: 5,155,660
[45] Date of Patent: Oct. 13, 1992

[54] SEMICONDUCTOR DEVICE

[75] Inventors: Toshifusa Yamada; Shin Soyano, both of Kanagawa, Japan

[73] Assignee: Fuji Electric Co., Ltd., Kanagawa, Japan

[21] Appl. No.: 760,906

[22] Filed: Sep. 17, 1991

[30] Foreign Application Priority Data

Sep. 17, 1990 [JP] Japan ............................... 2-97377[U]
Nov. 26, 1990 [JP] Japan ............................... 2-322146

[51] Int. Cl.⁵ .............................................. H05K 7/20
[52] U.S. Cl. ................................... 361/386; 361/392; 361/394; 361/395; 361/408; 174/52.2; 174/52.3; 165/185; 357/81
[58] Field of Search ............... 361/386, 388, 392, 394, 361/395, 399, 400, 401, 405, 408, 415; 174/52.2, 52.3; 165/185; 357/72, 76, 80, 81

[56] References Cited

U.S. PATENT DOCUMENTS 3,293,510 12/1966 Pfaffenberger ................. 317/234
3,916,080 10/1975 Wakamatsu ................... 174/17.05
4,249,034 2/1981 Fichot et al. .................. 174/52 H

FOREIGN PATENT DOCUMENTS 0198097 8/1989 Japan ................................. 361/386

Primary Examiner—Leo P. Picard
Assistant Examiner—Young S. Whang
Attorney, Agent, or Firm—Finnegan, Henderson, Farabow, Garrett and Dunner

[57] ABSTRACT

A semiconductor device is provided with a base plate on which a circuit board is disposed. A plurality of semiconductor elements such as diodes or transistors are supported on the circuit board and interconnected by circuit wiring. A container for the device includes side walls extending upwardly from the base plate and a top cover extending between the walls. An external terminal connection is provided by an internal terminal and an external terminal that are connected by a flexible wire within the container. The internal terminal has its lower end soldered to the circuit wiring at a predetermined location and its upper end disposed in a seat in the top cover. An upwardly extending slit within the seat receives the end of the internal terminal and a transverse window opens to the slit to receive a transverse protrusion from the upper terminal end. The external terminal extends through the cover with its lower end extending inwardly of the cover where the flexible wire is connected to it.

7 Claims, 3 Drawing Sheets

SEMICONDUCTOR DEVICE

BACKGROUND OF THE INVENTION

1. Field of the Invention

The present invention relates to a semiconductor device such as a transistor module in which an internal connecting terminal held by an insulating member forming an upper container cover is brazed onto circuit wiring connected to a semiconductor element on a circuit board when the semiconductor element secured onto the circuit board are connected to the internal connecting terminal.

2. Discussion of the Related Art

FIGS. 7, 8 show a conventional construction of a prior art semiconductor device. As shown in FIGS. 7, 8, the prior art semiconductor device comprises a circuit board 1, semiconductor elements 3, a leading-out terminal 15a which, before being led out, is soldered onto a circuit wiring pattern 2 stuck to the circuit board 1, a metal radiating plate 11, a container 5 combining the metal radiating plate 11, an upper cover 5a and side walls 5b made of resin, a gelatinous silicone resin layer 16, and an epoxy resin layer 17.

A soldering leg 15c bent in an L shape and a curved damper 15b for setting thermal stress free are formed at the trailing end and the intermediate portion of the leading-out terminal 15a, respectively. The upper end of that terminal 15a is passed through and led out of the upper cover 5a.

The conventional semiconductor device is assembled in the following way. First, the semiconductor element 3 is joined onto the circuit board 1 by die bonding, the radiating plate 11 being fastened to the undersurface of the circuit board under a different process beforehand. Then the leading-out terminal 15a, passed through and secured to the upper cover 5a of the container 5, is mounted on the circuit board 1. In this state, the leg 15c of the terminal 15a is subsequently joined onto the circuit wiring 2 by reflow soldering. Although there is shown only one terminal 15a in FIG. 7, a plurality of leading-out terminals are secured to the upper cover 5a of the container 5 in an actual semiconductor device. These leading-out terminals are uprightly projected from the board 1. After the reflow soldering is completed, side walls 5b of the container 5 are secured to the metal radiating plate 11 and then an empty space inside the container 5 is filled with silicone resin 16 through the gap between the upper cover 5a and the side wall 5b. Further, epoxy resin 17 is injected into the remaining space on the upper layer side and hardened in order to resin-seal the container 5.

The conventional semiconductor device described above, particularly the leading-out terminal construction, has posed the following problems in view of assembly precision, parts handling and the like. As the leading-out terminal 15a is made by pressing a metal sheet, it may be deformed by external force when it is stored or handled. On the other hand, if the terminal becomes deformed even slightly, it will be difficult to secure the flatness and positional accuracy of the terminal leg 15c by soldering during assembly as described above. This forms the determining cause for defective soldering with respect to the circuit board 1. In the case of a semiconductor device in which the position of the terminal 15a set and soldered onto the circuit wiring 2 of the circuit board 1, and that of leading out the external terminal disposed on the upper cover 5a of the container 5, are separated as viewed from a horizontal plane, various individually designed and different by dimensioned and shaped leading-out terminals will be required in line with the circuit wiring 2.

With the conventional terminal construction left intact, it is difficult to not only standardize the configurations and dimensions of terminal parts for use in semiconductor devices having more than one kind of circuit wiring 2, different in wiring pattern, but also obtain a high degree of dimensional tolerance at the time of assembly and this causes an increase in cost.

SUMMARY OF THE INVENTION

The present invention has been made in view of the above circumstances and has as an object to provide a semiconductor device in which better coupling is provided for internal circuitry to one or more external terminals so that higher device reliability, greater assembly tolerance and extended standardization for different kinds of circuit wiring patterns.

Additional objects and advantages of the invention will be set forth in part of the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the semiconductor device of this invention comprises a circuit board having a circuit wiring pattern for semiconductor elements mounted thereon, container means having a radiating plate for supporting the semiconductor elements and further having side walls and an upper cover with a terminal support seat provided therein, at least one lead-out terminal means having an internal terminal extending upwardly from the circuit board and having one end circuit board, the lead-out means further having an external terminal extending through and secured to the upper cover, the internal terminal having its other end supported in the terminal support seat on the inner side of the upper cover, and a flexible wire connecting the internal and external terminals.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings, FIG. 2(a) thereof.

DESCRIPTION OF THE PREFERRED EMBODIMENTS

Figure 1:
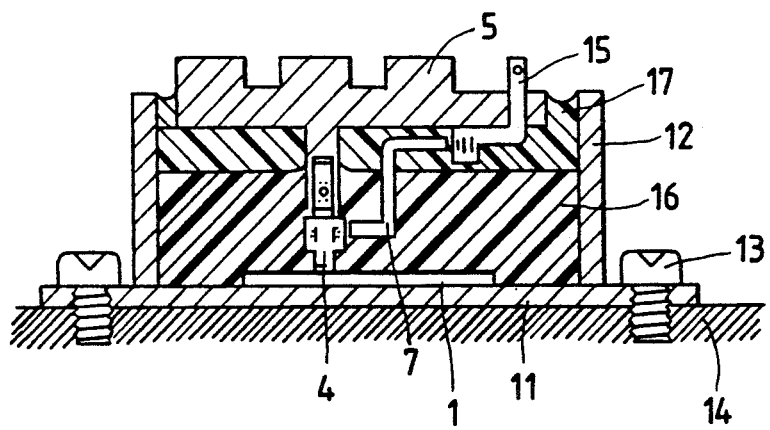
FIG. 1 is a sectional view of an embodiment of the present invention.

The present invention has been made in view of the foregoing prior art problems and thus an object thereof is to provide a semiconductor device so designed as to deal with different kinds of circuit wiring patterns by employing a terminal plate standardized in shape and dimension and simultaneously to secure a high degree of assembly tolerance and particularly what is characterized by a unique leading-out terminal construction.

In accordance with the present invention, a semiconductor device incorporating semiconductor elements, a circuit board mounting the semiconductor elements, a leading-out terminal connected to a circuit wiring pattern on the circuit board and led out therefrom and the like in a container combining a metal radiating plate, side walls and an upper cover together, is characterized in that the leading-out terminal is divided into an internal terminal uprightly soldered onto the circuit board and an external terminal passed through and fitted to the upper container cover, that the leading end of the internal terminal is held to a terminal support seat formed on the inner side of the upper cover after the manner of plugging, and that the internal and the external terminal are connected with a flexible lead wire.

Moreover, the other end of the internal terminal is loosely inserted into a slit which becomes deep in a direction perpendicular to the board and is formed in the terminal support seat formed on the inner side of the container cover and a protrusion formed on one side of the internal terminal is idly fitted in a window opened transversely into the terminal support seat and communicating with the slit.

Furthermore, the protrusion may be formed on the internal terminal by embossing a plate-like terminal into a semicircular one.

In addition, the protrusion may be formed on the internal terminal by raising a notch made in a platelike terminal.

Further, a semiconductor device incorporating semiconductor elements, a circuit board mounting the semiconductor elements, a leading-out terminal connected to a circuit wiring pattern on the circuit board and led out therefrom and the like in a container combining a metal radiating plate, side walls and an upper cover together, is characterized in that the leading-out terminal is divided into an internal terminal uprightly soldered onto the circuit board and an external terminal passed through and fitted to the upper cover of the container, that the other end of the internal terminal is held to a terminal support seat formed on the inner side of the upper cover after the manner of plugging, that the internal and the external terminal are connected with a flexible lead wire, and that any spot halfway down the flexible lead wire may be held onto a lead wire support seat formed on the inner side of the upper cover.

In the arrangement described above, the internal and the external terminal are those standardized in that they are small in dimension and simple in configuration. There is almost nearly no fear for those parts to be deformed in terms of dimension, configuration, flatness and the like while they are stored and handled. As the internal terminal is separated from the external one and fitted right above a position facing the circuit wiring pattern on the board side, a high degree of tolerance may be secured with respect to the board.

As the internal and the external terminal are connected with the flexible lead wire, moreover, no trouble will be incurred even though the soldering position set on the circuit wiring pattern on the board is set apart from the drawing position of the terminal below the upper container cover.

Further, by making the terminal support seat of the upper container cover hold any spot halfway down the flexible lead wire, the lead wire is prevented from unexpectedly bending and shifting from the wiring position to the extent that it moves closer to and comes in contact with another lead wire, terminal or circuit part even though the container is filled with resin. Interference trouble resulting therefrom can thus be prevented.

Figures 4A, 4B:
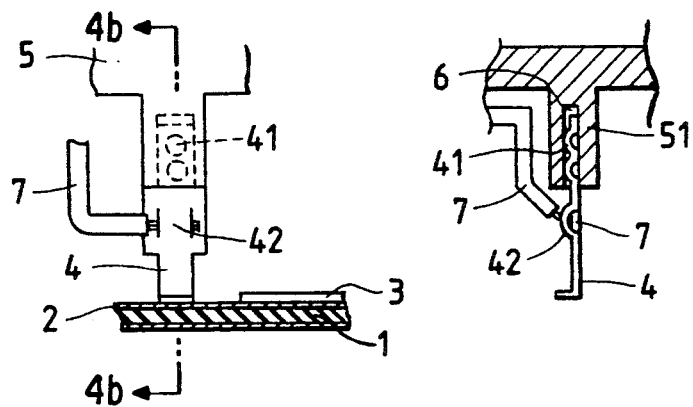
FIGS. 4a and 4b illustrates another construction of the internal connecting terminal according to the present invention.

More particularly, a power transistor module (FIGS. 4(a) and 4(b) includes in accordance with the present invention a plurality of semiconductor elements (chips) secured to a circuit board within a container means and these elements are connected by means of a circuit wiring pattern on the board. Improved lead-out terminal means provides for external connection. The lead-out terminal means preferable includes an internal terminal connected to the wiring and coupled to an external terminal. An illustrative example of an internal connecting terminal as a component part of such a semiconductor device. FIG. 4(a) illustrates the principal part of the semiconductor device in which a semiconductor chip 3 is further fixed onto a circuit board 1 with circuit wiring 2 stuck onto both sides thereof, the circuit wiring being formed with copper foil in order to constitute a desired circuit, and an electrode on the undersurface of the semiconductor chip 3 is directly brazed onto the wiring 2. An electrode on the surface is connected by thin-wire bonding (not shown) to the circuit wiring pattern 2 different in location from the brazed wiring 2 described above. The trailing end of the internal terminal 4 made of copper is soldered onto the wiring 2, whereas the upper portion thereof is held onto an upper container cover 5 made of resin.

The holding of the terminal 4 onto the upper cover 5 is made, as shown in FIG. 4(b), by forming a protrusion 41 in the upper part of the terminal 4, providing a terminal support seat 51 under the upper cover 5, the terminal support seat being projected downward, and forcing the terminal 4 into a slit 6 cut in the terminal support seat 51 while the protrusion 41 somewhat greater in width than the slit is slightly deformed. The internal terminal 4 is connected to the external terminal (not shown) using a lead wire 7 in such a way that the leading end of the lead wire is forced into the bridge 42 of the internal terminal.

Figures 5A, 5B:
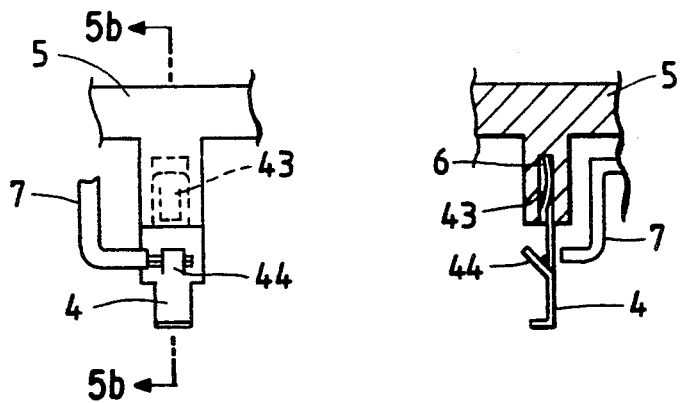
FIGS. 5a and 5b illustrates still another construction of the internal connecting terminal according to the present invention.

In another example shown in FIGS. 5(a), 5(b), raised portions 43, 44, in place of the protrusion shown in FIG. 4, are formed on the internal terminal 4 to force the internal terminal 4 into the slit 6 and to connect the lead wire 7 to the internal wire 4.

FIG. 1 illustrates another semiconductor device embodying the present invention and like reference characters designate like and corresponding parts in the following drawings. The container of the semiconductor device consists of a bottom plate 11 as a radiating plate made of copper, side walls 12 and an upper cover 5 which are made of resin. The bottom plate 11 for use is fixed to a radiating cooling fin 14 with mounting screws 13. A circuit board 1 is secured onto the bottom plate 11 of the container and one end of an internal connecting terminal 4 is soldered onto circuit wiring 2 made of copper foil and stuck onto the circuit board 1. The internal terminal 4 and an external terminal 15 passing through the upper cover 5 are connected by means of a lead wire 7. A space inside the container is filled with a silicone gel 16 and epoxy resin 17.

Figure 2A:
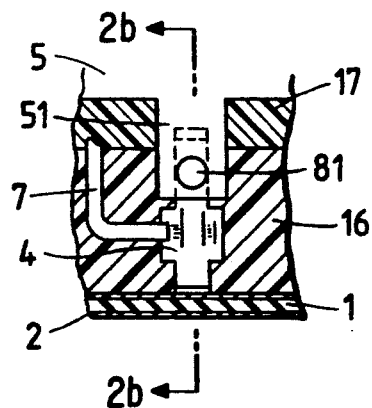
FIG. 2(a) is a sectional view illustrating the construction of the terminal according to the present invention.
Figure 2B:
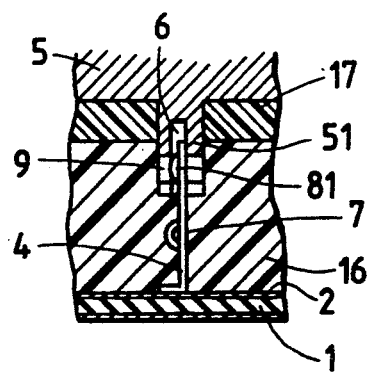
FIG. 2(b) is a sectional view taken on line A—A of FIG. 2(a)

FIGS. 2(a) and 2(b) illustrate a construction for holding the internal connecting terminal 4 used in the semiconductor device. As the breadth of a slit 6 made in a terminal support seat 51 projecting from the container cover 5 is greater than the thickness of the terminal 4, the terminal 4 is not forced into the slit 6 but only loosely inserted therein. A portion of the internal terminal 4 inserted into the slit is pressed to form a semicircular protrusion 81 and the head of the protrusion 81 is, as shown in an enlarged view of FIG. 3, located in a circular window 9 communicating with the slit and opened into the terminal support seat 51 as a resin member of the upper cover 5.

Although the height of the protrusion 81 is set greater than the breadth of the slit 6, the internal terminal 4 is inserted from the lower opening of the slit 6 while the protrusion 81 is forcing the slit to expand. As the window 9 is opened in the terminal support seat 51 of the upper cover 5 made of resin, the protrusion is resiliently deformable, so that the internal terminal 4 can readily be inserted. After the internal terminal is inserted, the protrusion returns to the original dimension due to its resilient restoring force and the lower edge of the protrusion 81 is caught by the lower edge of the window 9. The internal terminal is thus prevented from slipping off during of assembling the semiconductor device. Consequently, the internal terminal 4 is held uprightly in the slit 6 and as the trailing end of the internal terminal 4 is made to flatly stick to the surface of the circuit wiring pattern 2 of copper foil on the circuit board 1, it is easily securing thereto with solder.

Figure 3A:
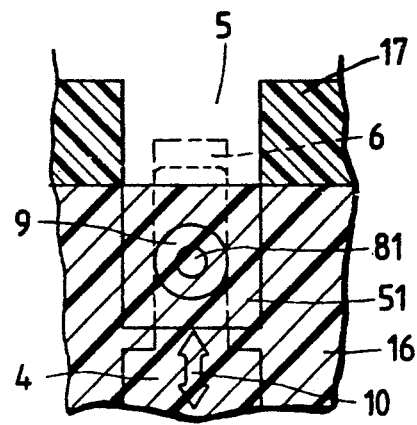
FIGS. 3a and 3b are partial enlarged views of FIGS. 2a and 2b, respectively.

Moreover, the window 9 filled with the silicone gel 16 allows the internal terminal 4 secured to the circuit board 1 to move freely as shown by an arrow 10 of FIG. 3(a). It is therefore possible to absorb a relative positional fluctuation of about 300 μm between the internal terminal 4 and the upper cover 5, the positional fluctuation resulting from expansion due to heat up to about 150° C. during the operation of the semiconductor device and the cooling contraction thereof. In other words, functional stability can be maintained as no stress is applied to the solder.

Figures 6A, 6B:
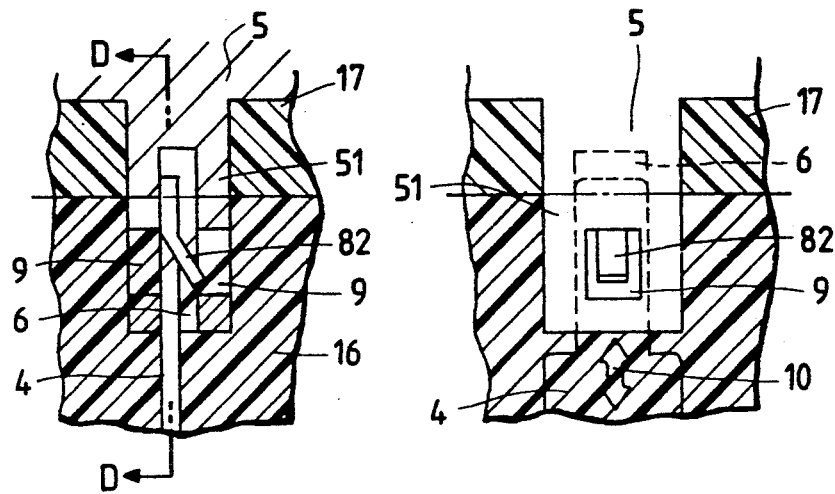
FIGS. 6a and 6b are partial enlarged views of FIGS. 5a and 5b, respectively.
Figure 7:
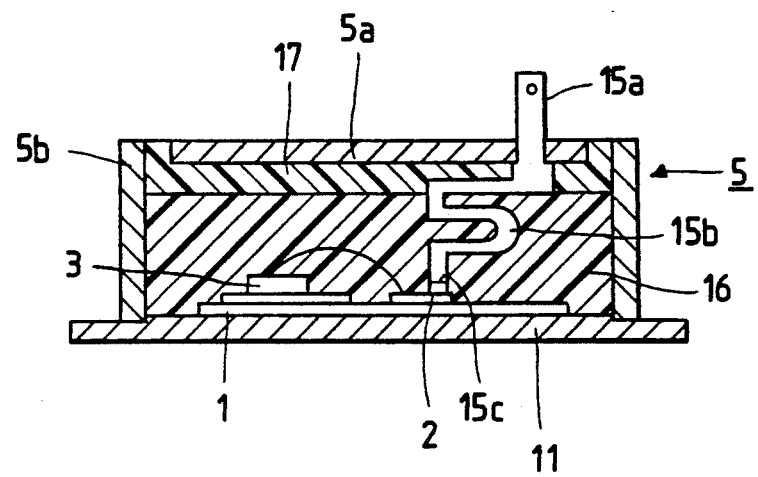
FIG. 7 is a sectional view of a conventional semiconductor device.
Figure 8:
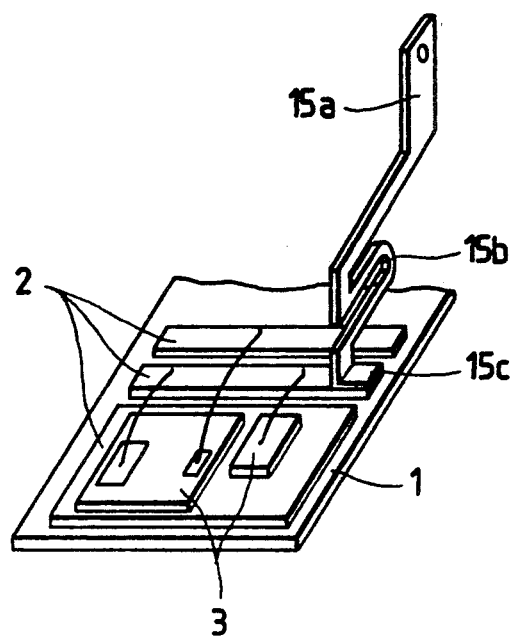
FIG. 8 is a perspective view of the internal construction of the conventional semiconductor device.

FIGS. 6(a), 6(b) illustrate another construction for holding the internal connecting terminal of a semiconductor device according to the present invention. In this case, a tongue-like protrusion 82 is raised from the internal terminal 4 and it is located in a square window 9 formed in the terminal support seat 51 of the upper cover and communicating with the slit 6 so as to act the role of preventing the internal terminal from slipping off. As this tongue-like protrusion 82 is deformable so that its height is decreased when the terminal 4 is inserted into the slit 6, the terminal is simply inserted.

Figure 3B:
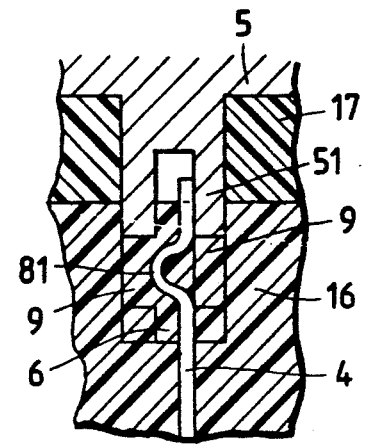

As shown in FIGS. 2, 3 and 6, there are provided a pair of windows 9 transversely, whereby the terminal 4 may be inserted into the slit 6 with one side having the protrusion 81, 82 reversed in accordance with the pattern of the circuit wiring 2.

The semiconductor device constructed as described above has the following effects. Namely, the leading-out terminal is, as claimed in claim 1, divided into the internal terminal with on end uprightly soldered onto the circuit board and the external terminal passed through the upper cover of the container. The leading end of the internal terminal is held to the terminal support seat formed on the inner side of the upper cover after the manner of plugging. In addition, the internal and the external terminal are mutually connected with the flexible lead wire.

(1) Each of the terminal pieces is smaller in dimension, simpler in external appearance than the conventional integral one, and freer from deformation, so that it is easy to control its storage and handling. Moreover, a stable soldering operation can be performed as a flat soldering surface is secured.

(2) Even if the soldering spot set on the circuit wiring pattern of the circuit board and the terminal leading-out position arranged on the upper container cover are located apart as viewed from the horizontal plane, the internal and external terminals having standardized dimensions and configurations may be used to solve this problem by varying the wiring length of the lead wire. Therefore, restrictions on the circuit wiring pattern on the board, the arrangement of the terminal to be fitted to and led out of the upper container cover and the like are relaxed. As a result, increased freedom of design-making, together with the use of such standardized terminal pieces, contributes to implementing cost reduction.

Further, the internal connecting terminal is loosely inserted into the slit formed in the slit formed in the terminal support seat of the upper container cover and directed to the bottom plate, whereas the protrusion formed on the internal terminal is idly fitted in the window opened into the terminal support seat to make the internal terminal movable in the depth direction of the slit. As a result, adversely-affecting dimensional variations resulting from temperature fluctuations due to the heat generated in the semiconductor device become absorbable. Moreover, as the protrusion is caught by the edge of the window, the terminal is prevented from slipping off. The protrusion can easily be formed by locally embossing or raising a platelike internal terminal. The window filled with gel material enables the terminal to move while protecting the semiconductor element.

The foregoing description of preferred embodiments of the invention has been presented for purposes of illustration and description. It is not intended to be exhaustive or to limit the invention to the precise form disclosed, and modifications and variation are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device comprising:
   a circuit board having a circuit wiring pattern in semiconductor elements mounted thereon;
   container means having a radiating plate for supporting said semiconductor elements and further having side walls and an upper cover with a terminal support seat provided therein;

at least one lead-out terminal means having an internal terminal extending upwardly from said circuit board and having one end soldered to the circuit wiring at a predetermined location on said circuit board;

said lead-out terminal means further having an external terminal extending through and secured to said upper cover;

said internal terminal having its other end supported in said terminal support seat on the inner side of said upper cover; and a flexible wire connecting said internal and external terminals.

2. The semiconductor device of claim 1 wherein a slit is formed in said seat and said other end of said internal terminal is disposed in said slit to extend upwardly therein in a direction perpendicular to said circuit board, and wherein a window opens transversely into said terminal support seat to communicate with said slit, said internal terminal having a protrusion fitted into said window.

3. The semiconductor device of claim 2 wherein said internal terminal is a plate-like member having an embossed semi-circular protrusion.

4. The semiconductor device of claim 2 wherein said internal terminal is a plate-like member having a raised notch that forms said protrusion.

5. The semiconductor device of claim 1, 2, or 5 wherein said lead wire is a wire having an insulator covering.

6. The semiconductor device of claim 1, 2, or 5 wherein each of said semiconductor elements any one of at least diode, thyristorand transistor elements.

7. The semiconductor device of claim 1 wherein means are provided on the inner side of said upper cover for supporting an intermediate portion of said flexible lead wire.

* * * * *

UNITED STATES PATENT AND TRADEMARK OFFICE
CERTIFICATE OF CORRECTION

PATENT NO. : 5,155,660
DATED : October 13, 1992
INVENTOR(S) : Toshifusa Yamada et al.

It is certified that error appears in the above-identified patent and that said Letters Patent is hereby corrected as shown below:

Claim 3, column 8, line 5, change "semi-circular" to --semicircular--.

Claim 5, column 8, line 9, change "5" to --7--.

Claim 6, column 8, line 12, change "5" to --7--.

Claim 6, column 8, line 13, insert "is" after --elements--.

Claim 6, column 8, line 14, change "thyristorand" to --thyristor and --.

Signed and Sealed this

Fourteenth Day of December, 1993

BRUCE LEHMAN

*Attest:*

*Attesting Officer*          *Commissioner of Patents and Trademarks*